United States Patent [19]

Levine

[11] Patent Number: 4,556,851

[45] Date of Patent: Dec. 3, 1985

[54] REDUCTION OF NOISE IN SIGNAL FROM CHARGE TRANSFER DEVICES

[75] Inventor: Peter A. Levine, Mercer County, N.J.

[73] Assignee: RCA Corporation, Princeton, N.J.

[21] Appl. No.: 714,490

[22] Filed: Mar. 21, 1985

Related U.S. Application Data

[63] Continuation-in-part of Ser. No. 525,491, Aug. 22, 1983, abandoned.

[51] Int. Cl.[4] .............................................. H03K 9/02
[52] U.S. Cl. ....................................... 329/50; 329/109;
358/213; 365/183; 365/206; 377/60; 377/62
[58] Field of Search ........................... 329/50, 102, 109;
375/24, 94; 377/57–63; 365/183, 206, 207, 208;
307/238.1, 238.2, 238.4, 238.5, 238.6; 358/213

[56] References Cited

U.S. PATENT DOCUMENTS

Re. 30,087  8/1979  White et al. ............................ 377/60
4,309,624  1/1982  Hynecek et al. ....................... 377/58
4,330,753  5/1982  Davy ...................................... 329/50

OTHER PUBLICATIONS

Kosonocky et al., "Basic Concepts of Charge-Coupled Devices", RCA Review, vol. 36, pp. 566–593, Sep. 1975.

Primary Examiner—Siegfried H. Grimm
Attorney, Agent, or Firm—Joseph S. Tripoli; George E. Haas; Allen LeRoy Limberg

[57] ABSTRACT

The noise in the output signal from the floating diffusion output stage of a charge transfer device is reduced. Reset noise can be reduced by resetting the floating diffusion to an in-channel potential, rather than to the reset drain potential. Flicker noise or "1/f" noise in the electrometer stage following the floating diffusion is suppressed by high-pass or band-pass filtering the output signal samples, after which the filtered signal is synchronously detected against a harmonic of the clocking frequency of the charge transfer device to obtain full bandwidth output response. The filtering not only suppresses flicker noise or "1/f" noise, but also suppresses smear that afflicts output signal samples originating from a floating diffusion reset to an in-channel potential.

High frequency peaking of the full bandwidth output response can be obtained with reduced noise, using synchronous detection which does not suppress response to input signal components other than the sidebands of the harmonic of the clocking frequency used as switching carrier frequency. The filtering of the charge transfer device output signal, previous to synchronous detection, is allowed to pass high frequency components from bands outside the harmonic spectrum being synchronously detected. This provides for augmenting the high frequency components of the full bandwidth output response with high frequency components without correlation of their respective attendant noise components.

24 Claims, 7 Drawing Figures

REDUCTION OF NOISE IN SIGNAL FROM CHARGE TRANSFER DEVICES

This is a continuation-in-part of U.S. patent application Ser. No. 525,491 filed Aug. 22, 1983 and now abandoned.

The present invention relates to synchronous detection of signals from a charge transfer device, such as a charge-coupled-device (CCD) imager, having a floating diffusion output stage.

BACKGROUND OF THE INVENTION (In describing a charge transfer device this application will use the convention of considering the surface of a semiconductor substrate on which the gate electrodes of the charge transfer device are disposed as its "top" surface, regardless of the actual orientation of the device in space; words such as "under" and "over" will be in accordance with this convention.)

Typically, a floating diffusion output stage incorporates a metal-insulator-semiconductor field effect transistor (MISFET) connected with gate electrode to the floating diffusion and operated in common-drain (or common-source) configuration as an electrometer to measure the potential on the floating diffusion. This potential is indicative of charge in a potential well "under" the floating diffusion. The measurement of potential is at signal-sampling intervals having interspersed amongst them reset intervals, during which reset intervals the floating diffusion is clamped by MISFET action to the reference potential at a reset drain. More particularly, the floating diffusion is a virtual source in this MISFET action, which occurs responsive to potential applied to a reset gate electrode between the floating diffusion and reset drain. It is standard practice to interpose a gate electrode between the floating diffusion and the reset electrode and to apply direct potential to this gate electrode so interposed, this being done to prevent potential responses to the reset pulses from appearing on the floating diffusion owing to electrostatic induction.

The resetting process of periodically clamping the floating diffusion to the potential at the reset drain is undesirably accompanied by a type of noise called "reset" noise, arising from variations in the potential left upon the floating diffusion from one reset interval to another. (Reset noise is a problem with charge transfer devices having floating gate output stages, as well as ones with floating diffusion output stages.) Reset noise is the predominant noise in the upper-video frequencies of the output signals of charge transfer devices such as CCD imagers, typically being about 8 dB larger than noise in the MISFET electrometer stage following the floating diffusion. At lower video frequencies flicker noise or "1/f" noise predominates.

The desirability of reducing both flicker noise and reset noise has led to the practice of correlated double sampling in which the signal on the floating diffusion is sampled, firstly, at a time when charge dependent upon reset noise but not upon signal is present in the potential well induced "under" the floating diffusion and, secondly, at a time when charge dependent upon both that reset noise and upon signal is present there. Each pair of samples is then differentially combined to generate samples which depend substantially only on the signal, with reset noise being suppressed. Correlated double sampling becomes less practical as the sampling rates of the charge transfer device output stage increases. Pulse widths become narrower and pulse spacing is lessened towards the limit allowed by the time for charge equilibration under the floating diffusion- or floating-gate output. As clock rates rise to more than a few megahertz, the correlated double sampling technique becomes progressively more difficult to employ.

L. N. Davy in his U.S. Pat. No. 4,330,753 issued May 18, 1982 and entitled "METHOD AND APPARATUS FOR RECOVERING SIGNAL FROM A CHARGE TRANSFER DEVICE" describes a method for obtaining what he characterizes as relatively noise-free information signals from the output stage of a charge transfer device. In the method Davy describes, the output signal from the regularly sampling electrometer stage is passed through a band-pass filter to separate double-sideband amplitude-modulation (DSB AM) sidebands flanking a harmonic of the clocking frequency of the electrometer stage. The separated sidebands are then synchronously detected using a switching demodulator operated at the harmonic of that clocking frequency. The amplitude-modulating signal is heterodyned to baseband spectrum by the switching demodulator. The baseband spectrum of the synchronously detected AM sidebands is separated from the harmonic spectra associated with it and is used as the output signal from the charge transfer device, rather than the baseband spectrum of the imager output signal, which is suppressed by the band-pass filtering before synchronous detection. The method Davy describes is effective in suppressing the 1/f noise in the electrometer stage, since 1/f noise resides principally in the baseband. It is relatively simple as compared with correlated double sampling to reduce the baseband entirely or at least up to the one or two megahertz frequencies where 1/f noise exceeds the thermal noise background. On the other hand, while with correlated double sampling 20 dB noise reduction is obtainable at 100 kHz in the imager system the inventor has been working with, it is practically difficult to obtain more than three to six dB noise reduction at 1 MHz. Difficulties arise with making pulses narrower owing to system bandwidth limitations, or with making them closer together, owing to the time needed for charge equilibration under the floating diffusion.

Reset noise is ignored by Davy; but, as noted above, reset noise is a primary source of noise in a semiconductor imager with a floating gate or floating diffusion output stage. Reset noise is wideband and extends through the harmonic frequency spectra of the video samples supplied at the semiconductor imager output, so reset noise is a major contributor to noise, even when synchronous detection of the sidebands surrounding a clocking frequency harmonic is used to recover video signal from the imager output samples. (It is to be understood that reset noise does not refer to the simple feedthrough of reset pulses, the reduction of which feedthrough Davy does concern himself with.)

W. F. Kosonocky and J. E. Carnes of RCA Corporation's David Sarnoff Research Center described the floating-diffusion amplifier in their paper entitled "Basic Concepts of Charge-Coupled Devices" and published September 1975 in *RCA Review*, Vol. 36, pp. 566–593. The paper suggests resetting of the floating diffusion to the barrier potential afforded by a gate biased with direct potential and interposed between the floating diffusion and a gate operative as a reset gate. That is, the floating diffusion is reset to a channel potential within the charge transfer channel in which the floating diffusion is disposed, rather than to the drain potential at the end of the charge transfer channel. This approach to resetting the floating diffusion has for the most part been discarded as impractical by those skilled in the art, because it introduces a pronounced low-frequency distortion in the modulation transfer function (MTF). Smearing of the trailing edges of bright areas into darker areas is noted in television displays based on the video samples from CCD imagers having floating diffusion output stages reset to in-channel voltages rather than to drain voltages, when the output stages have their output samples processed conventionally, using a sample-and-hold output circuit to suppress clock feedthrough.

While operating a CCD imager with floating diffusion output stage connected by high-pass filter to a sample-and-hold circuit for suppressing clock feedthrough and for eliminating the baseband and its associated 1/f noise, the present inventor happened to misadjust the level of reset pulses to the output stage. Surprisingly, reset noise in the video signal from the sample-and-hold circuit fell to levels normally experienced only with correlated double sampling. It was determined that resetting was to an in-channel voltage, even though the television display based on the video from the imager did not exhibit the low-frequency distortion normally associated with such resetting operation.

The inventor, in his U.S. patent application Ser. No. 590,044, filed Mar. 15, 1984, entitled "CCD FLOATING-ELEMENT OUTPUT STAGES PROVIDING LOW RESET NOISE WITH SINGLE SAMPLING", and assigned like the present application to RCA Corporation, has described another way to keep reset noise low. This other way allows the floating diffusion to be reset by relatively low-impedance clamp to a reset drain potential, responsive to reset pulses being applied to the reset gate between the floating diffusion and the reset drain diffusion of the CCD output stage. A simple RC high-pass filter is used to differentiate the CCD output signals before their synchronous detection at the first harmonic of their clocking, or sampling, rate. The corner frequency of this RC high-pass filter is chosen to suppress the 1/f noise in the lower baseband frequencies of the signal synchronously detected. Reset noise is suppressed in the synchronous detection output signal by applying reset pulses to the reset gate electrode at times preceding admission of charge packets under the floating diffusion. Reset pulses precede charge packet admissions by time intervals longer than the reciprocal of the high-pass filter corner frequency in radians per unit time. This other way of keeping reset noise low is favored by many engineers, since the amplitude of reset pulses need not be so well controlled, as long as it is large enough to guarantee relatively low-impedance clamp of the floating diffusion to the reset drain diffusion during the duration of each reset pulse.

The modulation transfer factor (MTF) of a CCD rolls off at higher frequencies. To obtain flat response from the CCD, it has been common practice, particularly in the CCD camera art, to peak the high frequencies. Peaking is done by cascading after the CCD a linear-phase amplifier with gain boosted at high frequencies to compensate for the roll-off of high frequencies in the MTF of the CCD. Peaking increases the high frequency noise originally in the CCD and in elements of the amplifier, increasing it by the same factor as signal. It would be more desirable if the high-frequency roll-off of CCD MTF could be corrected boosting high-frequency signal by a factor larger than that by which high-frequency noise is increased.

Davy in his U.S. Pat. No. 4,330,753 describes the DSB AM sidebands seperated from the CCD imager output signal by band-pass filtering being applied to a balanced modulator to be synchronously detected. The balanced modulator demodulates the DSB AM sidebands at the harmonic of the clocking frequency to recover a replica of the original baseband signal content of the CCD output samples. Davy also discloses that synchronous detection can be made to show response for selected component spectra of the complete CCD output sample frequency spectrum by establishing a proper relationship between (a) the duty factor of the output samples from the CCD and (b) which of the clocking frequency harmonics is chosen for synchronous detection. Davy uses synchronous detection to suppress response to all components of the CCD output signal, except for one selected harmonic spectrum component of that CCD output signal. Response to the baseband component of the CCD output signal is suppressed in the output response of the balanced modulator used for synchronous detection; that is, feedthrough of the baseband component to synchronous detector output is prevented by a cancellation of input signal in the balanced modulator output circuit.

Supposing one modified Davy's apparatus to synchronously detect using a demodulator that is not balanced with regard to the sidebands being demodulated, the demodulator could feed additional components of the CCD output samples through to its output, were it not for the suppression of these other components by the band-pass filter. For example, supposing synchronous detection to proceed at the first harmonic of CCD clocking frequency (i.e., at that frequency itself), broadening the band-pass filter bandwidth would cause the upper frequencies of the baseband to feed through to the synchronous detector output. (A portion of the lower sideband of the second harmonic of carrier frequency could also feed through to the synchronous detector output. But the energy in it would be relatively small in most instances, owing to MTF roll-off, and would not be heterodyned to baseband.)

The additional upper frequency components that feed through the synchronous detector augment in a scalar addition process the upper frequencies recovered from the first harmonic sidebands by synchronous detection. Application of this general principle is made, for example, in the designing of stereophonic FM radio receivers of the time-division de-multiplexer type, in order to combine information in the baseband and in the stereophonic subchannel. What is of interest in the context of the invention presently being described is the effect feedthrough of the baseband spectrum through the synchronous detector has with regard to random noise arising in the imager electrometer MISFET and in the amplifier circuitry between the imager and the synchronous detector.

The high-frequency noise from baseband feedthrough is uncorrelated with high-frequency noise from synchronous detection at clocking frequency of the remainder of the signal, for all frequencies except half and three-halves clocking frequency. But noise at half and three-halves clocking frequency is above the band of interest in the processed CCD output signal. So then, scalar augmentation of the upper frequencies of CCD response, obtained by synchronous detection at clocking frequencies, is accompanied by only vectorially summed upper frequency noise components from the baseband and synchronously detected clocking-frequency sidebands. Accordingly, raising high-frequency response by the augmentation process disclosed in this specification provides up to a 3 dB better signal-to-noise ratio in the higher frequencies than is obtainable by conventional peaking.

Rather than using a band-pass filter to select the components of CCD output sample spectrum to be synchronously detected, one may arrange to trap energy from the CCD output sample spectrum prior to the synchronous detection process. This is advantageously done using a high-pass, low-reject filter for the lower frequencies of the spectrum below the double sideband spectrum being synchronous detected in its entirety at a carrier frequency harmonic.

This high pass filter can be a simple RC network. Where a floating diffusion electrometer with low-impedance clamp to reset drain during read is used, the RC high-pass filter is preferable to a band-pass filter before the synchronous detector. The band pass filter has a tendency towards ringing, which interferes with suppressing reset noise.

SUMMARY OF THE INVENTION

The invention is embodied in one of its aspects in a method for operating a charge transfer device, such as a semiconductor imager, which charge transfer device is of the type employing a floating-diffusion output stage. This method comprises the steps of (a) resetting the floating diffusion to in-channel voltages on the charge transfer channel in which the floating diffusion is located to suppress reset noise in the imager output signal, (b) suppressing at least the lower of the baseband frequency components of the samples clocked out of the floating-diffusion output stage to suppress flicker noise in the imager output signal otherwise arising in the electrometer portions of said floating diffusion output stage, and (c) synchronously detecting the remaining frequency components of the samples to obtain a baseband video signal. The suppression of lower baseband frequencies also gets rid of the smear associated with resetting the floating diffusion to an in-channel potential. The invention is also embodied in other of its aspects in apparatus for carrying out the foregoing method.

In another aspect of the invention the synchronous detection is carried forward using sample-and-hold circuitry to suppress clock feedthrough and to reduce the need for subsequent smoothing of baseband video signal, rather than using switch demodulation as described by Davy.

In yet another aspect of the invention high frequency peaking is provided to a semiconductor imager output signal synchronously detected at a harmonic of CCD output register clock frequency, by feeding through the synchronous detector higher frequencies of the baseband spectrum of the imager output signal.

DETAILED DESCRIPTION

Figure 1:
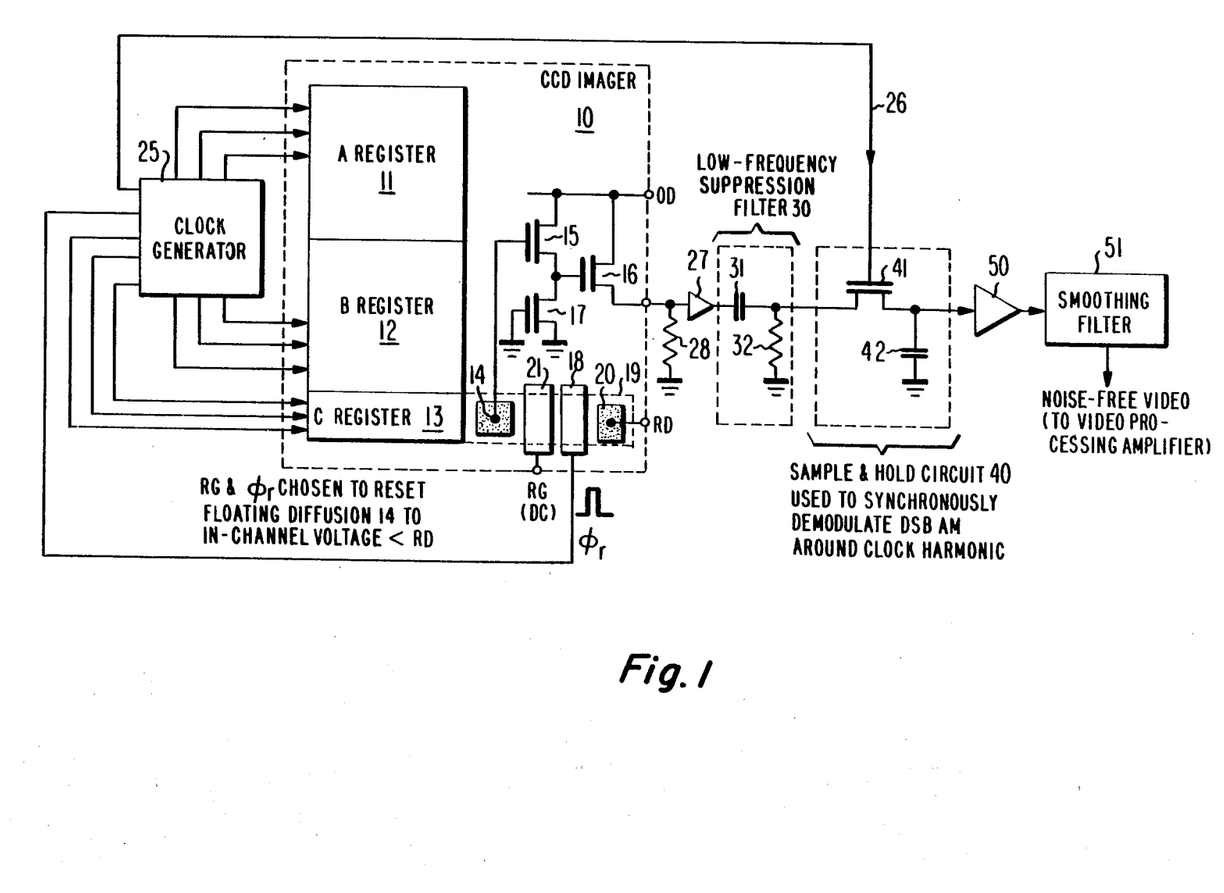
FIG. 1 is a schematic diagram of the signal recovery system of the present invention, shown used with a CCD imager of the field transfer type.

In FIG. 1 the signal recovery system of the invention is shown being used with a semiconductor imager which by way of example is a CCD imager 10 of field transfer type. In addition to the floating diffusion output stage associated with charge transfer devices operated in accordance with the invention, CCD imager 10 includes per convention an image or A register 11, a field storage or B register 12, and a parallel-input-series-output or C register 13. Charge packets are regularly clocked forward from the output of C register 13 to a potential well disposed under floating diffusion 14, and the magnitude of charge in each packet is then determined by an electrometer comprising a cascade connection of source-follower metal-insulator-semiconductor field effect transistors 15 and 16. A further MISFET 17 is connected as a constant-current-generator source load for MISFET 15, and MISFET 16 is provided a source load by off-chip resistor 28 across which the CCD imager 10 output signal samples appear. A direct potential OD is applied to the drains of MISFET's 15 and 16 to condition them for source follower operation.

After each charge packet is measured, the potential on floating diffusion 14 as applied to the gate of MISFET 15 is reset responsive to a $\Phi_r$ pulse applied to a reset gate 18. This pulse per convention is somewhat narrower than the clocking pulse applied to the last clocked gate (not specifically shown) of C register 13 and is disposed to occur within the time that clocking pulse appears. Reset gate 18 is disposed "over" a charge transfer channel 19 extending through the C register 13 and beyond to include floating diffusion 14 and a reset drain 20. More particularly, reset gate 18 is disposed "over" charge transfer channel 19 between floating diffusion 14 and reset drain 20 and is preceded by a d-c gate 21, to which gate 21 a direct potential RG is applied. D-c gate 21 is preferably a short gate to reduce the amount of charge thereunder and is used to prevent the $\Phi_r$ pulses applied to reset gate 18 from electrostatically coupling to floating diffusion 14.

As will be explained in more detail later on in the specification, in practicing certain aspects of the invention, resetting of the potential on floating diffusion 14 departs from the now-standard practice of clamping to the direct potential RD applied to the reset drain 20. Instead, in one alternative for practicing the invention, resetting is to a barrier height established in charge transfer channel 19 and "under" reset gate 18 responsive to the peak of the $\Phi_r$ pulse applied to reset gate 18. Alternatively, in a preferred embodiment of the invention resetting is to the barrier height established in charge transfer channel 19 under d-c gate 21 by the direct potential RG applied to d-c gate 21.

Resetting to an in-channel potential generates much less reset noise than resetting to reset drain potential. It has been theorized that the higher noise in resetting to reset drain potential by MISFET action involving floating diffusion 14, reset gate 18 and reset drain 20 may be a form of partitioning noise, generated during collapse of the conduction channel established between floating diffusion 14 and reset drain 20 by MISFET action.

A clock generator 25 is shown in FIG. 1 supplying three-phase clocking signals to A register 11, B register 12 and C register 13 as usually applied to a CCD imager of field transfer type. Other well-known clocking schemes using two-, four-, single- or virtual-phase clocking could be used instead. Clock generator 25 generates $\Phi_r$ pulses within the time periods of the clocking pulses applied to the last clocked gate of C register 13. Clock generator 25 also supplies pulses, at a repetition rate harmonic to the clocking frequency of C register 13 during serial line read-out, as carrier for synchronously detecting CCD imager 10 signal, which pulses are supplied via line 26.

CCD imager 10 output samples are by way of example applied to the input circuit of a low-noise amplifier 27. Amplifier 27 provides the voltage gain which raises signal level such that its accompanying noise is larger than that introduced by the synchronous detection process to follow. The amplified imager 10 output samples are supplied at low source impedence from the output circuit of amplifier 27 to be passed through a low-frequency suppression filter 30 prior to synchronous detection. Filter 30 suppresses at least as much of the baseband of the frequency spectrum of the CCD imager 10 output samples as are accompanied by noise substantially large as compared to background thermal noise. Filter 30 may be a band-pass filter for selecting one pair of double-sideband amplitude modulation (DSB AM) sidebands for synchronous detection (more precisely, those around the carrier frequency corresponding to the repetition rate of the carrier pulses supplied by clock generator 25 via line 26) in line with Davy's description. Filter 30 is shown in FIG. 1, however, as a simple RC high-pass filter comprising a series-arm capacitor 31 and a shunt-leg resistor 32.

A 430 picofarad capacitor 31 and a 75-ohm resistor 32 have been used in one signal recovery system built in accordance with the invention, which system synchronously detects the signal across resistor 32 at the 7.5 MHz first harmonic of C register 13 clocking frequency. The filter 30 has a 5 MHz corner frequency, so the upper frequencies of the baseband spectrum of the CCD imager 10 output samples combine with the demodulated first harmonic spectrum to provide video high-frequency peaking. The baseband signal remnants and the demodulated first-harmonic-spectrum signal are correlated and add algebraically, while the noise components from the respective bands are uncorrelated and add vectorially. So signal-to-noise advantages accrue with this form of video high-frequency peaking.

Davy describes the use of switching demodulators for synchronous detection, and they can be used in the present invention. However, switching demodulators perform average detection, in which the recovered baseband is accompanied by strong harmonic spectra. It is preferable to use a synchronous detection process that is peak detection by nature to reduce the strength of the harmonic spectra remnant from the detection process relative to the recovered base-band spectrum. A sample-and-hold circuit 40 will perform as such a synchronous detector. FIG. 1 shows a simple sample-and-hold circuit 40 comprising the selectively conductive channel of a MISFET 41 with which to sample and a capacitor 42 with which to hold the sample. The gate of MISFET 41 receives from line 26 the pulses supplied at a harmonic of C register clocking frequency, and its channel is selectively rendered conductive responsive to these pulses. MISFET 41 is operative, then, as a transmission gate of a type where control signals (from line 26) do not feed through to any appreciable extent to the selectively conductive channel. The output circuit of this form of synchronous detector is not balanced respective to input signals supplied to the selectively conductive channel. Baseband spectrum applied to its input feeds through to its output, which accommodates the video high-frequency peaking scheme described in the previous paragraph.

Detected output signal from sample-and-hold circuit 40, unlike that from a switching demodulator, is usable video signal with no need for filtering beyond that afforded by video amplifier cut-off. Detected output signal is shown in FIG. 1 applied to a buffer amplifier 50 and thence to a smoothing filter 51, which is preferably a low-pass filter that removes clocking frequency remnants so as to supply noise-free video signal that is also free of aliasing on image details. This noise-free video will usually be directed to a video processing amplifier (not shown) where synchronizing and equalizing pulses will be inserted at times coordinated with the timing of clock generator 25.

The differences between resetting floating diffusion 14 to reset drain potential and to an in-channel potential will now be explained more specifically with the aid of potential profile diagrams. Per convention, these diagrams will at their tops have stylized representations of the features encountered by charge packets moving from left to right in the charge transfer channel, and more positive potentials will be more downward in the diagrams. The diagrams will assume empty potential well under floating diffusion 14, and fringing field effects will for sake of simplicity be ignored when not essential to understanding operation.

Figure 2:
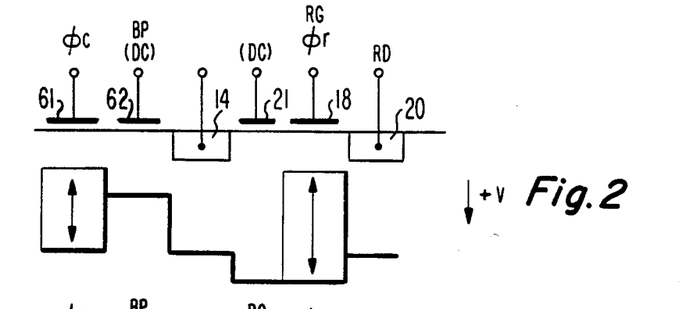
FIG. 2 is a potential profile descriptive of resetting the floating diffusion to reset drain potential as is now-standard practice.

FIG. 2 is a potential profile diagram descriptive of resetting floating diffusion 14 to reset drain potential RD applied to reset drain 20. $\Phi_c$ is the phase of C register clocking applied during line read-out to the last clocked gate 61 of C register 13. C register 13 has a final gate 62 following clocked gate 61, to which final gate a direct potential BP is applied. BP establishes a barrier height to block the passage of charge from a potential well under clocked gate 61 to a potential well under floating diffusion 14 except when $\Phi_c$ pulses gate 61 to less positive potential. Gate 21 has a potential RG applied to it as positive as, or more positive than, the drain potential RD. Fringing field effects will strongly affect the actual in-channel potential under gate 21, which is normally made very short to reduce charge sharing with the floating diffusion 14. $\Phi_r$ ranges from a negative enough voltage to erect an unsurmountable barrier for passage of charge from floating diffusion 14 to reset drain 20 diffusion during charge measurement time, to a positive enough voltage during reset time to allow the charge level under floating diffusion 14 to drain to RD potential as shown. Consequently floating diffusion 14 is reset to reset drain potential RD.

Figure 3:
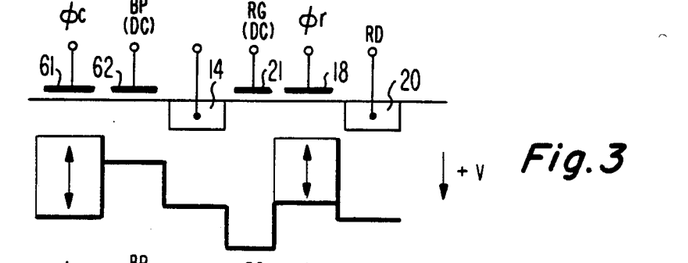
FIGS. 3, 4 and 5 are potential profiles descriptive of different representative ways in which resetting of a floating diffusion to an in-channel potential, rather than to reset drain potential, may be accomplished as an element of certain aspects of the invention.

FIG. 3 is a potential profile diagram descriptive of resetting floating diffusion 14 to an in-channel potential established by the most positive excursion of $\Phi_r$, which is not so positive as RD. This most positive excursion presents a lowered barrier height which will be surmounted by charge carriers in the region of floating diffusion 14 and under gate 21, until a potential level somewhat more positive than the barrier height is established on the floating diffusion 14. This potential is less positive than RD. Reset is to the barrier height with a small offset owing to dark current flowing responsive to thermal excitation of charge carriers. (Variation in the offset owing to this thermal excitation is a principal cause of the low-frequency peak up of the baseband of the MTF when reset is to an in-channel potential.) The problem with this way of resetting to in-channel potential is that there is some problem with suppressing noise on the positive peaks of the $\Phi_r$ pulses.

Figure 4:
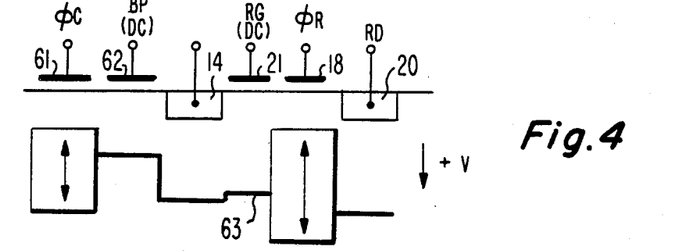

FIG. 4 is a potential profile diagram of a preferred way of resetting floating diffusion 14 to an in-channel potential. Reset gate 18 is operated over a range including reset drain potential RD as in resetting the floating diffusion 14 to reset drain potential, so the positive excursion of $\Phi_r$ is not the in-channel potential to which floating diffusion 14 is reset. Rather, the direct potential RG applied to d-c gate 21, which direct potential is easily filtered to remove noise therefrom, is made less positive than reset drain voltage RD. A potential barrier 63 is erected under d-c gate 21, and floating diffusion 14 resets to the barrier potential, with a slight positive offset owing to thermal emptying, since the flow of charge to reset drain 20 when reset gate 18 is positively pulsed proceeds only until the barrier potential can no longer be surmounted.

Figure 5:
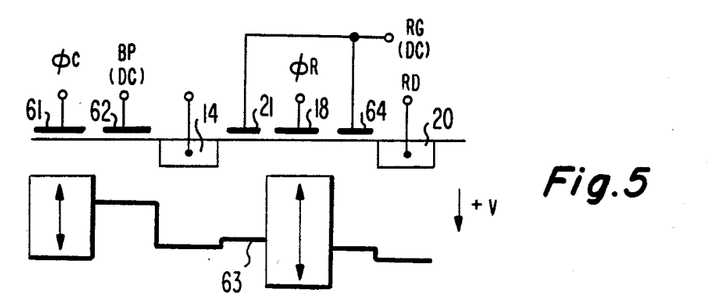

FIG. 5 is a potential profile diagram of resetting to floating diffusion 14 barrier potential under d-c gate 21 when reset gate 18 has a further d-c gate 64 interposed between it and reset drain 20. Such a further d-c gate 64 is found in the CCD imagers presently manufactured by RCA Corporation, samples of which were used in actually reducing the invention to practice. This further d-c gate 64 is internally connected to d-c gate 21 in these devices. The strongly preferred direction of flow of charge from under reset gate 18 when gate 18 is no longer positively pulsed is towards reset drain 20. This is because the barrier potential under d-c gate 21 tends to be less easily surmounted then the barrier potential under d-c gate 64, owing to fringing field from reset drain 20 reducing the barrier height under d-c gate 64.

As noted in the "BACKGROUND OF THE INVENTION" portion of this specification, a modified FIG. 1 apparatus can provide for video output signal substantially free of reset noise, even though the $\phi_r$ pulses are of such amplitude as to cause floating diffusion 14 to exhibit a relatively low-impedance clamp to reset drain diffusion 19. Low reset noise is achieved by applying reset pulses to reset gate electrode 18 at times preceding admission of charge packets under floating diffusion 14 by intervals each substantially as long as the reciprocal of the corner frequency in radians per unit time of low-frequency suppression filter 30. That corner frequency is determined by the capacitance C of capacitor 31 and the resistance R of resistor 32, as known in the art.

Figure 6:
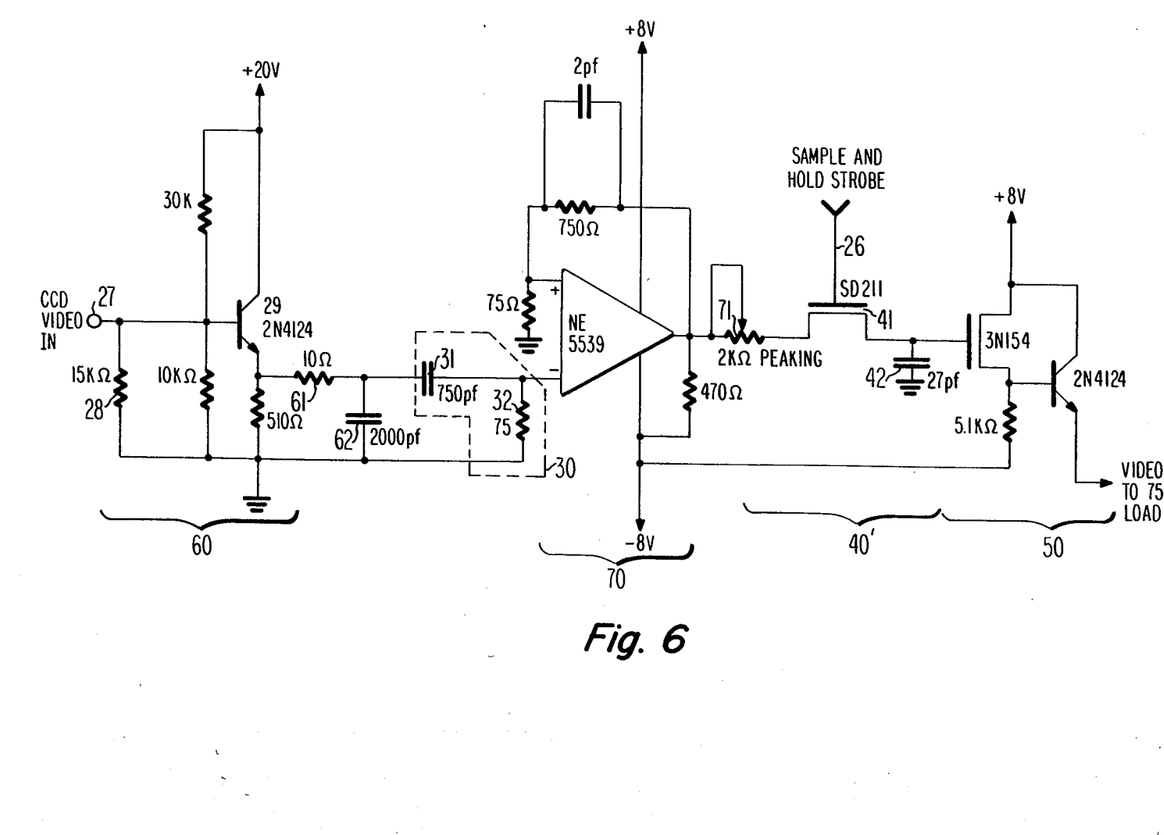
FIG. 6 is a schematic diagram of an alternate signal recovery system, embodying the present invention and providing adjustable high-frequency peaking of output video signal.

FIG. 6 shows the later refinements made in the FIG. 1 apparatus and in the modified FIG. 1 apparatus to accommodate the adjustment of video peaking. The single video amplifier 27 is replaced by a voltage-follower amplifier 60, and then eleven times voltage gain is supplied by a video amplifier 70 located after low-frequency suppression filter 30. A series-arm resistor 61 and a shunt-leg capacitor 62 provide a low-pass filter between voltage-follower amplifier 60 and low-frequency suppression filter 30, which low-pass filter rolls off frequency response above the first harmonic spectrum of C register 13 clocking frequency. This reduces the dynamic range of signals that video amplifier 70 must accommodate.

Low-frequency suppression filter 30 has its corner frequency chosen well down into baseband, so the signal supplied to video amplifier 70 is overpeaked. Flatter response is then obtained by a subsequent introduction of compensatory roll-off into the synchronous detector 40' output signal. This is simply done using an adjustable resistance 71 in series with the channel of sampling switch FET 41, as shown in FIG. 6, to increase the sampling resistance in the sample-and-hold operation used for synchronous detection.

Figure 7:
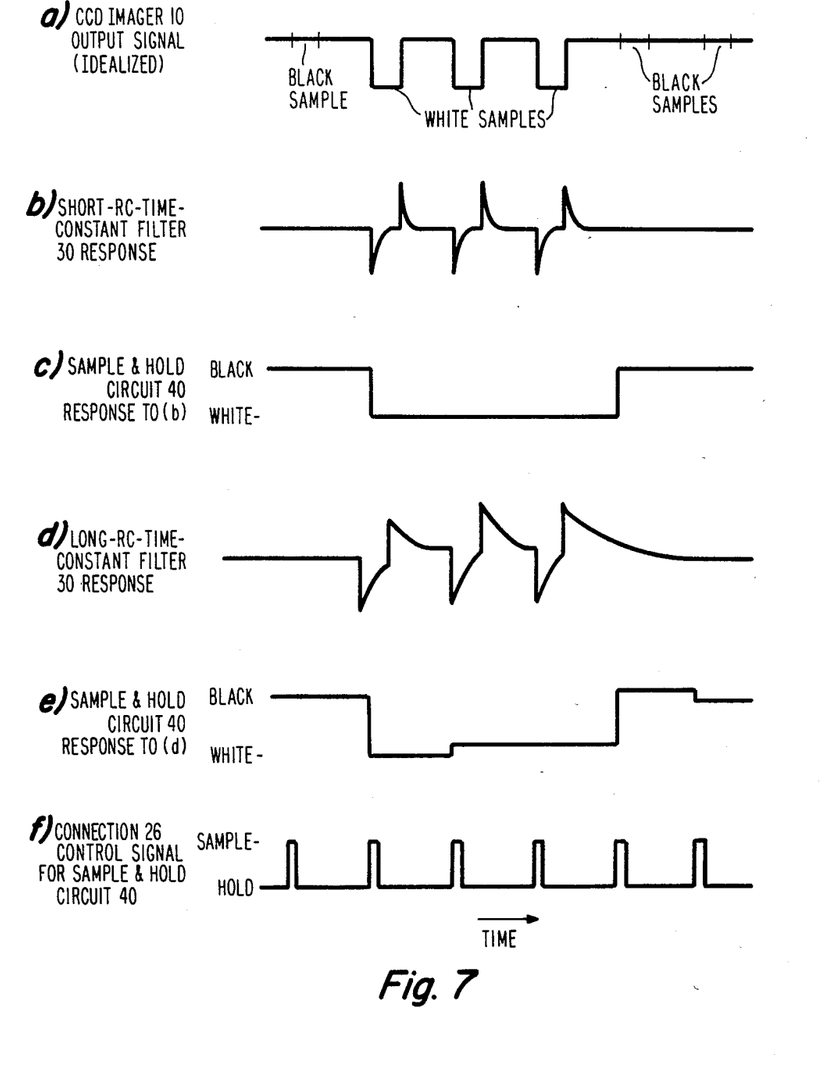
FIG. 7 is a timing diagram helpful in understanding the nature of video peaking provided in accordance with an aspect of the invention.

FIG. 7 is a timing diagram that is an aid to considering, in the time domain rather than the frequency domain, how the video high frequency peaking of sample-and-hold circuit 40 synchronous detection response comes about. As shown in FIG. 7 waveform (a), the CCD imager output signal may be considered, idealized for ease of analysis, to be a succession of negative-going pulses, the amplitudes of which vary in accordance with pixel intensity. Waveform (a) is imager 10 response to a white vertical bar three samples in width. Passage through low-frequency suppression filter 30 differentiates these pulses to cause positive-going spikes at positive-going transitions of these pulses and negative-going pulses at negative-going transitions of these pulses. FIG. 7 waveform (b) shows filter 30 response if the RC time constant associated with capacitor 31 and resistor 32 is relatively short, so baseband frequencies are fully suppressed. One notes that the spike associated with each transition is substantially fully decayed before the next transition occurs. So sample-and-hold circuit 40 responds to each negative-going spike in waveform (b) substantially independently of its response to the preceding positive-going and negative-going spikes. That is, there is no substantial baseband frequency component for sample-and-hold circuitry 40 to synchronously detect. FIG. 7 waveform (f) shows the control signal supplied via connection 26 to sample and hold circuit 40. FIG. 7 waveform (c) shows sample-and-hold circuit 40 synchronous detection response to waveform (b) and is a response to the white vertical bar that has no video high frequency peaking.

FIG. 7 waveform (d) shows filter 30 response if the RC time constant is relatively long, so the upper baseband frequencies are not fully suppressed prior to the sample-and-hold circuit 40, used as a synchronous detector. In waveform (d), though the response to each negative-going transition is less than fully decayed before the onset of response to the succeeding positive-going transition, it is substantially fully decayed before the onset of response to the succeeding negative-going transition. This phenomenon does not interfere with there being a significant difference between the sample-and-hold circuit 40 synchronous detection responses to waveforms (b) and (d), but is not the source of that significant difference. The following phenomenon is. In waveform (d) the response to each positive-going transition is less than fully decayed before the onset of response to the succeeding negative-going transition. This means that the synchronous detection response of sample-and-hold circuit 40 to a negative spike response in waveform (d) to an image pixel is reduced by the opposite-polarity tail of the preceding positive spike response to the previous image pixel.

FIG. 7 waveform (e) shows the sample-and-hold circuit 40 response to FIG. 7 waveform (d). The white-going edge of the response to the white vertical bar is peaked because there is no positive-going spike response in waveform (d) to a preceding black sample from imager 10 to reduce the response to the negative-going spike response in waveform (d) to this first white sample from imager 10. Thereafter, the white response in waveform (e) is reduced, because there is positive-going spike response to each successive preceding white sample from imager 10.

There is positive-going spike response in waveform (d) to the last white sample from imager 10. This peaks the black-going edge of the response to the white vertical bar by an overshoot phenomenon analogous to the phenomenon responsible for peaking the white-going edge.

Note that the peaking of the edges of the waveform (e) response to the white vertical bar is as narrow as a single pixel. This peaking is accomplished without any ringing, as would be encountered when using resonant circuits to peak video over a single pixel or so.

What is claimed is:

1. A method of improving the signal-to-noise ratio of output signal from a charge transfer device, samples of which output signal are supplied at a clocking frequency rate via a floating diffusion and an electrometer stage, said method comprising the steps of:
   resetting said floating diffusion to an in-channel barrier potential, rather than resetting to a reset drain potential by field effect transistor action, for reducing reset noise;
   filtering the output signal samples supplied from said electrometer stage to suppress at least the lower frequencies of the baseband spectrum thereof, for reducing flicker noise or "1/f" noise, and for reducing smear generated by resetting said floating diffusion to an in-channel barrier potential; and
   synchronously detecting the filtered output signal samples, against a harmonic of said clocking frequency for obtaining an output signal with improved signal-to-noise and with baseband response extending through said suppressed lower frequencies.

2. A method as set forth in claim 1 wherein
   said step of synchronous detecting is carried forward by sampling the filtered output signal samples at said harmonic of said clocking frequency, and holding each sample until the next is taken.

3. A method as set forth in claim 1 wherein said step of filtering includes:
   filtering the baseband spectrum portion said output signal samples to suppress the lower frequencies thereof, but to pass the higher frequencies thereof, thereby to peak the corresponding higher frequencies in the output signal with improved signal-to-noise as obtained by said step of synchronously detecting.

4. A method as set forth in claim 3 wherein
   said step of synchronous detecting is carried forward by
   sampling the filtered output signal samples at said harmonic of said clocking frequency, and holding each sample until the next is taken.

5. In combination:
   a semiconductor substrate,
   a charge-transfer-device structure disposed at the surface of said substrate,
   a floating diffusion being disposed in said substrate at the output of said charge transfer device and having a potential well under it to which successive charge samples are clocked at a clocking frequency,
   an electrometer stage for supplying an output signal responsive to measurement of the charge stored in the potential well "under" said floating diffusion, said output signal having a baseband component and having double-sideband amplitude-modulation components around harmonics of said clocking frequency,
   a reset drain disposed in said substrate proximate to said floating diffusion, but with a separation therefrom, and connected to receive a reset drain potential;
   a reset gate electrode "over" said separation for receiving reset pulses at said clocking frequency;
   means for erecting a potential barrier in said substrate in said separation, to which potential barrier said floating diffusion is reset when said reset gate receives a reset pulse;
   a filter for filtering the output signal from said electrometer stage to supply a demodulator input signal in which frequencies of the baseband component are suppressed including at least the lower frequencies thereof; and
   a synchronous demodulator for synchronously demodulating said demodulator input signal at a harmonic of said clocking frequency.

6. A combination as set forth in claim 5 wherein said synchronous demodulator is a sample-and-hold circuit sampling at said harmonic of said clocking frequency.

7. A combination as set forth in claim 6 wherein said filter supplies a demodulator input signal in which upper frequencies of said baseband component are not suppressed and wherein said sample-and-hold circuit supplies an output signal responsive to those upper frequencies of said baseband component as well as to synchronously demodulated double-sideband amplitude modulation components.

8. A combination as set forth in claim 6 wherein said filter is an RC high-pass filter with shunt resistance R and series capacitance C.

9. A combination as set forth in claim 5 wherein said means for erecting a potential barrier comprises:
   means for restricting the maximum excursion of said reset pulses.

10. A combination as set forth in claim 9 wherein said means for erecting a potential barrier comprises:
    a further gate electrode interposed between said floating diffusion and said reset gate and connected to a direct potential.

11. In combination:
    a semiconductor substrate,
    an imager structure with an output charge-coupled-device shift register disposed at the surface of said substrate,
    a floating diffusion being disposed in said substrate at the output of said charge-coupled-device shift register and having a potential well under it to which successive charge samples are clocked at a clocking frequency,
    an electrometer stage for supplying an output signal responsive to measurement of the charge stored in the potential well "under" said floating diffusion, said output signal having a baseband component and having double-sideband amplitude-modulation components around harmonics of said clocking frequency, a reset drain disposed in said substrate proximate to said floating diffusion, but with a separation therefrom, and connected to receive a reset drain potential;

a reset gate electrode "over" said separation for receiving reset pulses at said clocking frequency;

means for erecting a potential barrier in said substrate in said separation, to which potential barrier said floating diffusion is reset when said reset gate receives a reset pulse;

a filter for filtering the output signal from said electrometer stage to supply a demodulator input signal in which frequencies of the baseband component are suppressed including at least the lower frequencies thereof; and a synchronous demodulator for synchronously demodulating said demodulator input signal at a harmonic of said clocking frequency.

12. A combination as set forth in claim 11 wherein said synchronous demodulator is a sample-and-hold circuit sampling at said harmonic of said clocking frequency.

13. A combination as set forth in claim 12 wherein said filter supplies a demodulator input signal in which upper frequencies of said baseband component are not suppressed and wherein said sample-and-hold circuit supplies an output signal responsive to those upper frequencies of said baseband component as well as to synchronously demodulated double-sideband amplitude modulation components.

14. A combination as set forth in claim 12 wherein said filter is an RC high-pass filter with shunt resistance R and series capacitance C.

15. A combination as set forth in claim 11 wherein said means for erecting a potential barrier comprises:
means for restricting the maximum excursion of said reset pulses.

16. A combination as set forth in claim 11 wherein said means for erecting a potential barrier comprises:
a further gate electrode interposed between said floating diffusion and said reset gate and connected to a direct potential.

17. In combination with a charge coupled device arranged to be receptive of a regular clocking frequency for transferal of charge packets therethrough and to convert the transferred charge packets to signal samples supplied at an output circuit thereof, means for generating a response with an improved modulation transfer factor (MFT) at higher frequencies comprising:
a synchronous detector for demodulating at a carrier frequency that is harmonically related to said clocking frequency, having an output circuit for supplying said response with improved MTF at higher frequencies, having an input circuit, and not having its response balanced against the signal applied to its input circuit; and
filtering means, connecting the output circuit of said charge coupled device to the input circuit of said synchronous detector, for limiting the frequency spectrum of the energy from said signal samples supplied to said synchronous detector input circuit to include energy in the double sideband AM spectrum flanking said carrier frequency, to include the higher frequency content of the baseband spectrum of said signal samples, and to exclude the energy in at least the lower frequency portion of the baseband spectrum of said signal samples.

18. A combination as set forth in claim 17 wherein said filtering means includes:
means for trapping energy in the portion of the spectrum outside a band which is wider than that occupied by the double sideband AM components flanking said carrier frequency.

19. A combination as set forth in claim 18 wherein said carrier frequency is in first harmonic relationship to said clocking frequency.

20. A combination as set forth in claim 17 wherein said synchronous detector comprises a sample-and-hold circuit sampling at said carrier frequency.

21. In combination with a charge coupled device arranged to be receptive of a regular clocking frequency for transferral of charge packets therethrough and to convert the transferred charge packets to signal samples supplies at an output circuit thereof, means for generating a response with an improved modulation transfer factor (MTF) at higher frequencies comprising:
a high-pass filter, with an input circuit connected to receive said signal samples from the output circuit of said charge coupled device, and with an output circuit at which response to those signal samples is appreciably larger in the upper portion of a range of frequencies than in its lower portion, said range of frequencies extending upward from zero to one-half said clock frequency; and
a synchronous detector having an input circuit to which the output circuit of said high-pass filter connects, and having an output circuit supplying said response with an improved MTF at higher frequencies as a result of synchronous detection at a carrier-frequency equal to said clocking frequency.

22. A combination as set forth in claim 21 wherein said synchronous detector includes:
means for recurrently sampling at said clocking frequency signal received at the input circuit of said synchronous detector, and
means for holding each sample thus taken until the next is taken.

23. In the combination of a charge-coupled device (CCD) imager supplying a series of spaced image response samples at a clocked rate, a low-frequency suppression filter connected after said CCD imager to suppress flicker noise or "1/f" noise, and a sample-and-hold circuit sampling said image response samples with suppressed flicker noise or "1/f" noise at said clocked rate to provide an output video signal, the improvement wherein said low-frequency suppression filter passes the higher frequencies of the baseband spectrum of said spaced image response samples for providing video peaking of said output video signal.

24. In the combination of a charge-coupled device (CCD) imager supplying a series of spaced image response samples at a clocked rate, a low-frequency suppression filter connected after said CCD imager to suppress flicker noise or "1/f" noise, and a sample-and-hold circuit sampling said image response samples with suppressed flicker noise or "1/f" noise at said clocked rate to provide an output video signal; the improvement wherein said low-frequency suppression filter passes the higher frequencies of the baseband spectrum of said spaced image response samples for tending to over-peak said video output signal; and wherein said sample-and-hold circuit comprises:

a hold capacitor across which said output video signal is provided;

a sampling switch selectively providing at said clocked rate a relatively low impedance path for applying to said hold capacitor said image response samples with suppressed flicker noise; and means for controlling the impedance of said relatively low impedance path to allow adjustment of the peaking of said video output signal.

* * * * *